United States Patent [19]
Juengling et al.

[11] Patent Number: 6,080,672
[45] Date of Patent: *Jun. 27, 2000

[54] SELF-ALIGNED CONTACT FORMATION FOR SEMICONDUCTOR DEVICES

[75] Inventors: Werner Juengling; Kirk Prall; Trung T. Doan; Guy T. Blalock, all of Boise; David Dickerson, Bosie; David S. Becker, Boise, all of Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/915,386

[22] Filed: Aug. 20, 1997

[51] Int. Cl.$^7$ .................................................. H01L 21/00
[52] U.S. Cl. ........................... 438/692; 438/737; 438/743
[58] Field of Search ................... 216/38, 88; 438/633, 438/637, 639, 672, 692, 697, 723, 738, 743, 747, 735, 737

[56] References Cited

U.S. PATENT DOCUMENTS

| | | | |
|---|---|---|---|
| 4,354,896 | 10/1982 | Hunter et al. | 156/643 |
| 4,656,732 | 4/1987 | Teng et al. | 29/591 |
| 4,792,534 | 12/1988 | Tsuji et al. | 437/229 |
| 4,801,350 | 1/1989 | Mattox et al. | 156/643 |
| 4,912,061 | 3/1990 | Nasr | 437/44 |
| 4,962,414 | 10/1990 | Liou et al. | 357/71 |
| 5,117,273 | 5/1992 | Stark et al. | 357/54 |

(List continued on next page.)

FOREIGN PATENT DOCUMENTS

| | | |
|---|---|---|
| 0111706 | 3/1987 | European Pat. Off. . |
| 0265638 | 5/1988 | European Pat. Off. . |
| 0491408 | 6/1992 | European Pat. Off. . |

OTHER PUBLICATIONS

"Method to Produce Sizesin Openings in Photo Images Smaller than Lithographic Minimum Size", *IBM Technical Disclosure Bulletin*, 29, 1328, (Aug. 1986).

"Methods of Forming Small Contact Holes", *IBM Technical Disclosure Bulletin*, 30, 252, (Jan. 1988).

Fukase, T., et al., "A Margin–Free Contact Process Using An $Al_2O_3$ Etch–Stop Layer for High Density Devices", *International Electron Devices Meeting: Technical Digest*, 837–840, (1992).

(List continued on next page.)

*Primary Examiner*—William Powell
*Attorney, Agent, or Firm*—Schwegman, Lundberg, Woessner & Kluth, P.A.

[57] ABSTRACT

In accordance with the present invention, there is provided a method for fabricating a contact on an integrated circuit, such as a DRAM. The method includes the following steps. A gate stack is formed on the integrated circuit. A spacer is formed on sidewalls of the gate stack. An insulating film is formed on the integrated circuit. The insulating film is planarized. Finally, a gate contact opening is formed through the planarized insulating film. In one embodiment, the gate contact opening is formed by removing the insulator, spacer and insulating film by etching. In this embodiment, the insulator, spacer and insulating film are etched at substantially similar rates. As a result, the integrated circuit is tolerant of mask misalignments, and does not over-etch field oxide or create silicon nitride slivers. In another embodiment, the planarizing step is performed with chemical mechanical planarization to form a substantially flat topography on the surface of the integrated circuit. Thus, the present invention does not require lithography equipment with a relatively large field of depth. In yet a third embodiment, the method may comprise additional steps, including forming additional dielectric on the integrated circuit. Then, gate and bitline contact openings are formed through the additional dielectric. Finally, gate and bitline contacts are formed in self-alignment to the gate stacks. This embodiment may be implemented by forming the gate and bitline contact openings with an etch that removes the additional dielectric, but does not substantially remove the spacer. As a result, the bitline contact cannot be inadvertently connected to a gate stack that functions as a wordline. This connection might disable the integrated circuit.

16 Claims, 5 Drawing Sheets

U.S. PATENT DOCUMENTS

| | | | |
|---|---|---|---|
| 5,175,127 | 12/1992 | Manning | 437/195 |
| 5,206,187 | 4/1993 | Doan et al. | 437/192 |
| 5,229,326 | 7/1993 | Dennison et al. | 437/195 |
| 5,252,517 | 10/1993 | Blalock et al. | 437/195 |
| 5,292,677 | 3/1994 | Dennison | 437/52 |
| 5,300,807 | 4/1994 | Nelson | 257/632 |
| 5,362,666 | 11/1994 | Dennison | 437/52 |
| 5,411,909 | 5/1995 | Manning et al. | 438/692 X |
| 5,439,846 | 8/1995 | Nguyen et al. | 437/187 |
| 5,488,011 | 1/1996 | Figura et al. | 437/60 |
| 5,498,570 | 3/1996 | Becker | 437/187 |
| 5,605,864 | 2/1997 | Prall | 437/195 |
| 5,688,720 | 11/1997 | Hayashi | 438/692 X |
| 5,724,282 | 3/1998 | Loughmiller, D. R., et al. | 365/96 |
| 5,863,837 | 1/1999 | Sudo | 438/692 |
| 5,872,740 | 2/1999 | Loughmiller, D.R., et al. | 365/225.7 |
| 5,914,279 | 6/1999 | Yang et al. | 438/692 X |

OTHER PUBLICATIONS

Lau, C., et al., "A Super Self–Aligned Source/Drain MOSFET", *International Electron Devices Meeting: Technical Digest*, 358–361, (1987).

Singer, P., "A New Technology for Oxide Contact and Via Etch", *Semiconductor International*, 36, (Aug. 1993).

SELF-ALIGNED CONTACT FORMATION FOR SEMICONDUCTOR DEVICES

FIELD OF THE INVENTION

The present invention relates generally to contact formation on an integrated circuit, and more specifically to forming contacts on an integrated circuit to enhance fabrication yield.

BACKGROUND OF THE INVENTION

Integrated circuits, such as dynamic random access memories (DRAMs), are fabricated with devices that have microscopic features that can only be manufactured with processing steps that require careful alignment of equipment used to build the devices. The manufacturing costs of integrated circuits are expensive because (1) the processing steps must be accomplished with costly and sophisticated equipment, and experienced operators, and (2) such steps are not always successful. For example, if the processing equipment, such as a mask, is inadvertently misaligned, then the DRAM may be fabricated incorrectly and fail. As a result, processing yields decrease and production costs increase. Therefore, to reduce manufacturing costs, a DRAM fabrication process that has enhanced process tolerances is desirable. Such a process would permit successful fabrication of DRAMs, despite minor misalignments.

U.S. Pat. No. 5,439,846 to Nguyen et al. (hereinafter the Nguyen Patent), which is herein incorporated by reference, discloses a method of fabricating transistor contacts in DRAMs. The Nguyen Patent teaches consecutively forming silicon nitride, tungsten silicide, polysilicon, gate oxide and a field oxide on a silicon substrate to partially construct a transistor. Subsequently, a nitride etch is performed. Thus, a portion of the silicon nitride, defined by a masking process, is removed to expose the tungsten silicide. As a result, a contact can be later deposited on and connected to the exposed gate contact opening of the transistor.

Next, the Nguyen Patent teaches performing a gate etch to define gate stacks. Thus, portions of silicon nitride, tungsten silicide, polysilicon and gate oxide are removed from the substrate. However, if the nitride and gate etches are misaligned, for example due to mask misalignment, then field oxide may be inadvertently removed, or a sliver of silicon nitride may be formed on the gate contact. If field oxide is inadvertently removed, then the contact could short the gate stack to the silicon substrate. Hence, the transistor gate and active regions may be coupled, disabling the transistor. Alternatively, if the silicon nitride sliver is formed, then it may be more difficult to successfully complete subsequently performed processing steps used to form the contact on the gate contact opening. Therefore, it is desirable to fabricate DRAMs with a process that is more tolerant of misalignments between the nitride and gate etches.

Additionally, the topography of the DRAM is no longer flat after the nitride etch has been performed with the method of the Nguyen Patent. As a result, the lithography step used to define the gate stacks with the process of the Nguyen Patent must be performed with equipment having a relatively large field of depth, which may be more costly. Therefore, there is a need for a DRAM process that is tolerant of misalignments, and does not require lithography equipment with a relatively large field of depth.

SUMMARY OF THE INVENTION

In accordance with the present invention, there is provided a method for fabricating a contact on an integrated circuit, such as a DRAM. The method includes the following steps. A gate stack is formed on the integrated circuit. Spacers are formed on sidewalls of the gate stack. An insulating film is formed on the integrated circuit. The insulating film is planarized. Finally, a gate contact opening is formed through the planarized insulating film.

In one embodiment, the gate contact opening is formed by removing the insulator, spacer and insulating film by etching. In this embodiment, the insulator, spacer and insulating film are etched at substantially similar rates. As a result, the integrated circuit is tolerant of mask misalignments, and is not susceptible to over-etched field oxide or silicon nitride slivers.

In another embodiment, the planarizing step is performed with chemical mechanical planarization to form a substantially flat topography on the surface of the integrated circuit. Thus, the present invention does not require lithography equipment with a relatively large field of depth.

In yet a third embodiment, the method may comprise additional steps, including forming additional dielectric on the integrated circuit. Then, gate and bitline contact openings are formed through the additional dielectric. Finally, gate and bitline contacts are formed in self-alignment to the gate stacks. This embodiment may be implemented by forming the gate and bitline contact openings with an etch that removes the additional dielectric, but does not substantially remove the spacer. As a result, the bitline contact is not inadvertently connected to a gate stack that functions as a wordline. This connection might disable the integrated circuit.

Because it is more tolerant of misalignment, the present invention enhances the yield of current DRAM designs. Also, the present invention permits higher device density in future DRAM designs. Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like-reference numbers indicate identical or functionally similar elements. Additionally, the left-most(s) of a reference number identifies the drawing in which the reference number first appears.

DETAILED DESCRIPTION OF THE EMBODIMENT

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 1:
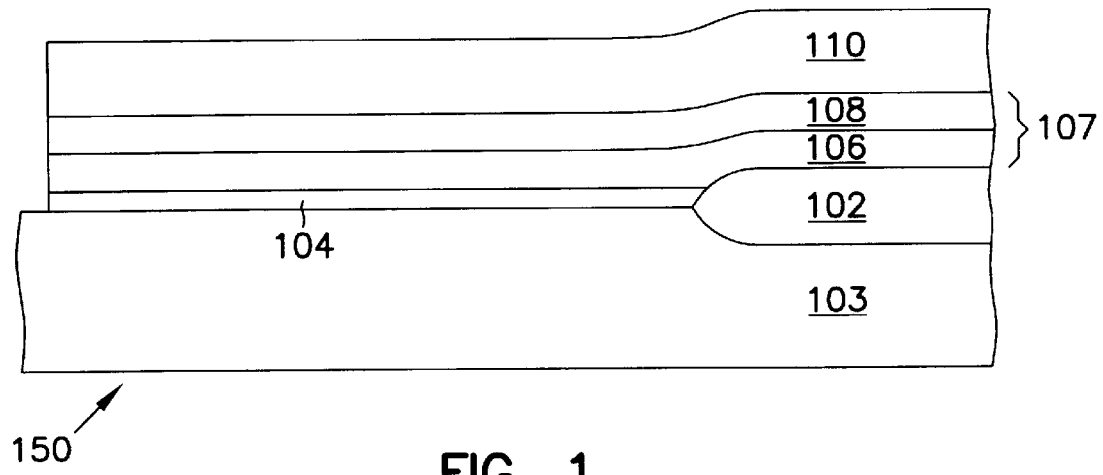
FIG. 1 is a cross-sectional view of the initial formation of an integrated circuit.
Figure 2:
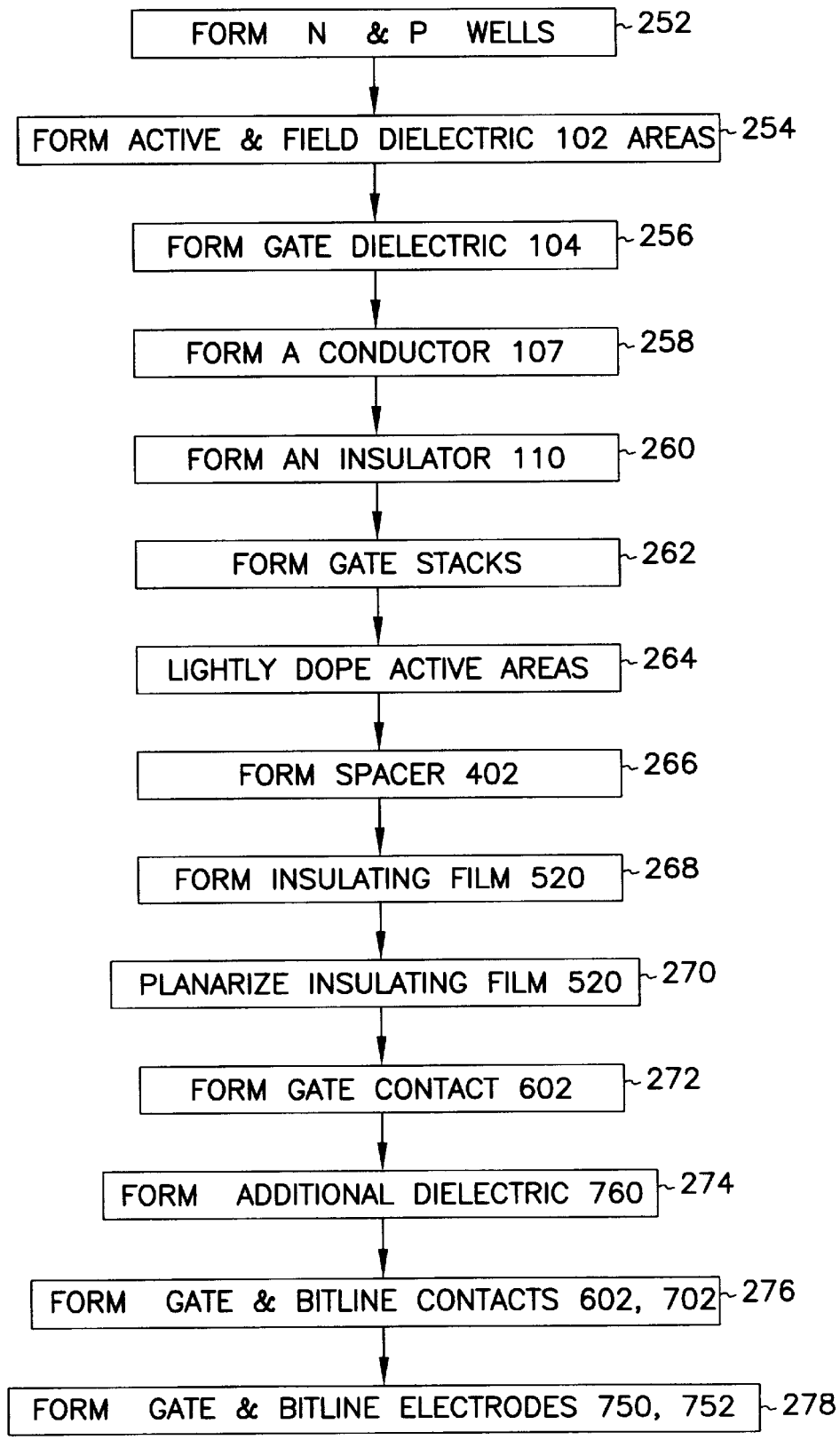
FIG. 2 is an illustration of the process flow of the present invention.

The present invention is directed toward facilitating a method for fabricating an integrated circuit, such as a DRAM. In the subsequently described embodiment, the present invention will be shown to form a DRAM. The initial formation of the DRAM 150 is shown in FIG. 1. The DRAM is subsequently manufactured in accordance with the process steps in FIG. 2. The DRAM 150 is first fabricated by forming n and p wells in a base layer 103 (step 252), such as a silicon. Subsequently active and field dielectric 102 areas are formed (step 254). Then gate dielectric 104 is formed on the base layer 103 (step 256). The gate dielectric 104 may be oxide or oxynitride. The oxide may be grown or deposited by conventional techniques. The field dielectric 102 may be an oxide, such as conventionally used field oxide.

Next, a conductor 107 is formed on the DRAM 150 (step 258). The conductor 107 may comprise one or more conductive layers, such as polysilicon 106 and tungsten silicide 108. The polysilicon 106 may be deposited and then doped, or deposited doped insitu. The tungsten silicide 108 may be formed by deposition or sputtering. Specific methods of forming the polysilicon 106 and tungsten silicide 108 are know to persons skilled in the art.

Next, an insulator 110 is deposited on the conductor 107 (step 260). The insulator 110 may be a nitride, an oxide or a combination thereof. In the exemplary embodiment, the insulator 110 is silicon nitride.

Figure 3:
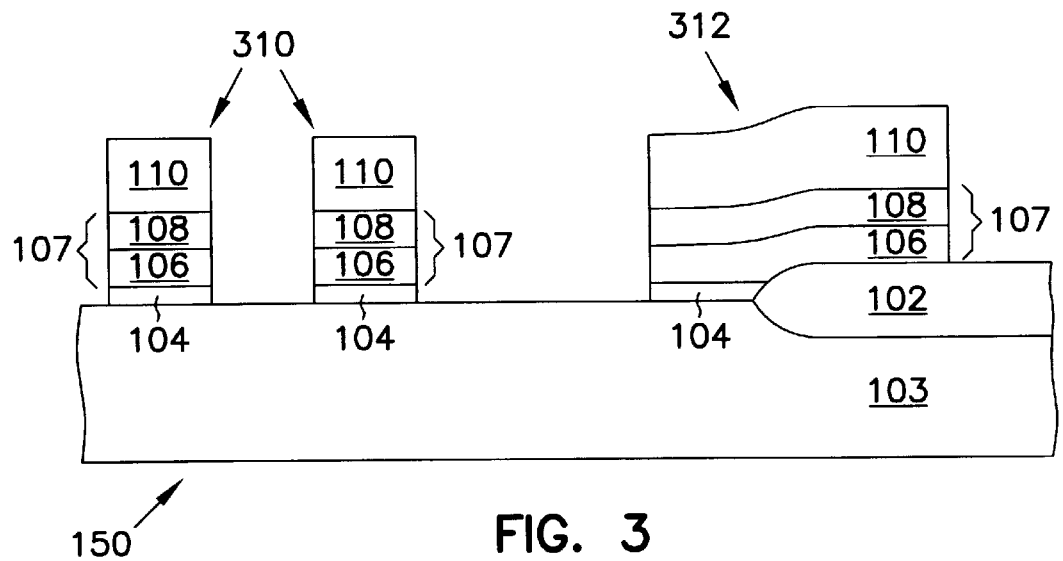
FIG. 3 is a cross-sectional view of the integrated circuit after formation of gate stacks.

Subsequently, gate stacks are formed by patterning and removing material from the DRAM 150 (step 262), as shown in FIG. 3. The gate stacks may be wordlines 310 and gates 312. Removal is performed with a gate etch. Methods of patterning and removal to form gate stacks are known to persons skilled in the art.

Next, the active areas are doped by a conventional implant, otherwise known as a lightly doped drain (LDD) implant (step 264). During the LDD implant (step 264), n- and p-type dopants are implanted in self-alignment to the gate stacks into uncovered active regions of the corresponding n and p wells of the DRAM 150.

Figure 4:
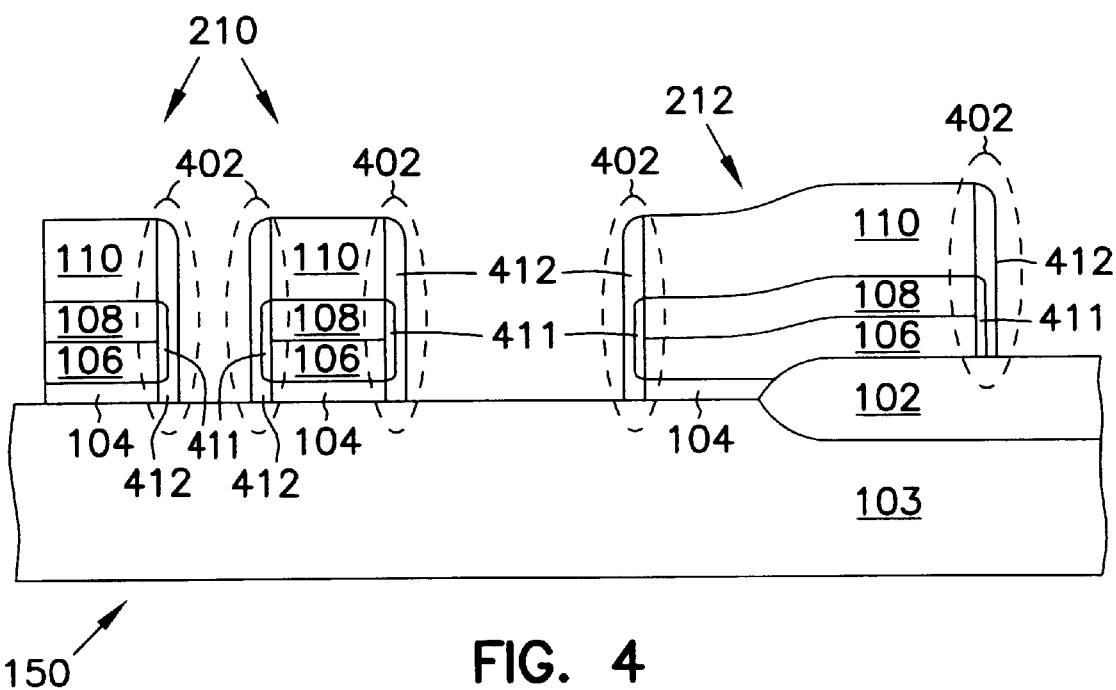
FIG. 4 is a cross-sectional view of the integrated circuit after formation of spacers.

After the LDD implant (step 264), a spacer 402 is formed on the sides of the wordlines 210 and gates 212 (step 266), as shown in FIG. 4. The spacer 402 can be comprised of one or more spacer insulators 411, 412. The spacer insulators 411, 412 may be oxides, nitrides or a combination thereof. For example, the spacer 402 may be comprised of a first spacer insulator 411 that is an oxide grown on the sidewalls of the conductor. Subsequently, the second spacer insulator 412, an oxide or nitride, is formed on first spacer insulator 411, the insulator 110, the field oxide 104, and the base layer 103. Alternatively, only the second spacer insulator 412 may be formed on the DRAM 150. In this case, the second spacer insulator 412 may be a nitride film that is deposited and then etched back.

Figure 5:
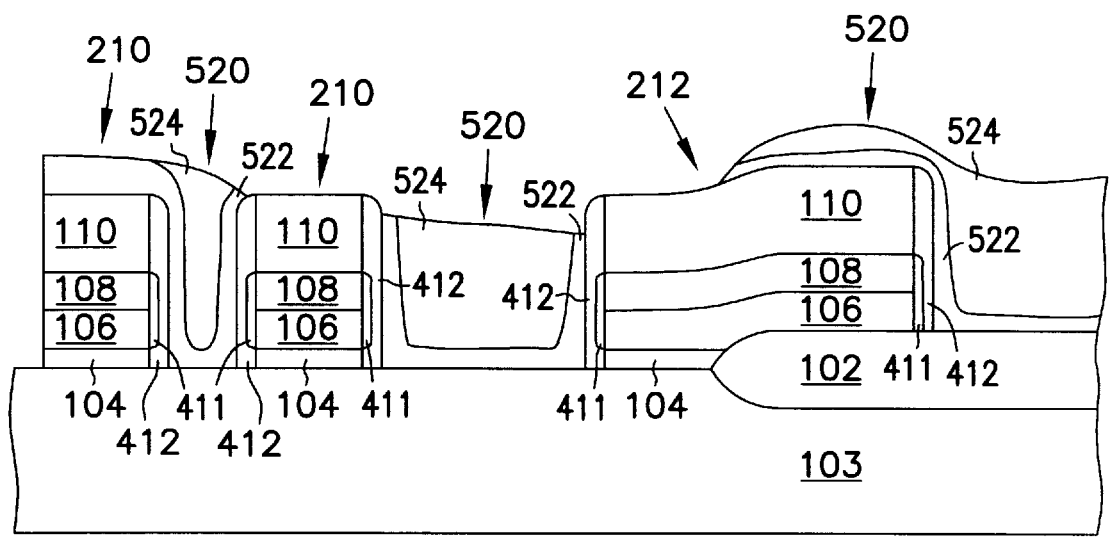
FIG. 5 is a cross-sectional view of the integrated circuit after formation of an insulator.

Subsequently, an insulating film 520 is formed on the DRAM 150 (step 268), as shown in FIG. 5. The insulating film may be formed by depositing tetraethyloxysilicate (TEOS) 522 and borophosphosilicate glass (BPSG) 524 in succession on the DRAM 150. The TEOS 522 is undoped. The BPSG 524 is doped. The TEOS 522 and BPSG 524 have respective thicknesses of between 100 angstroms and 500 angstroms, and 1000 angstroms and 3000 angstroms. Deposition of the insulating film 520 is performed in a manner known to persons skilled in the art.

Next, the BPSG 524 is planarized (step 270) to about the height of the gate stacks with chemical mechanical planarization (CMP). Because BPSG 524 can be easily planarized and CMP is selective to nitride, a substantially flat topology is readily formed on the DRAM 150 surface. Conventionally, the TEOS 522 and BPSG 544 are used to form capacitors in the DRAM 150. However, the present invention also utilizes the insulating film 520 to provide the flat topology on the DRAM 150. The flat topology permits patterning the gate contact opening with lithography equipment having a reduced field of depth.

Figure 6:
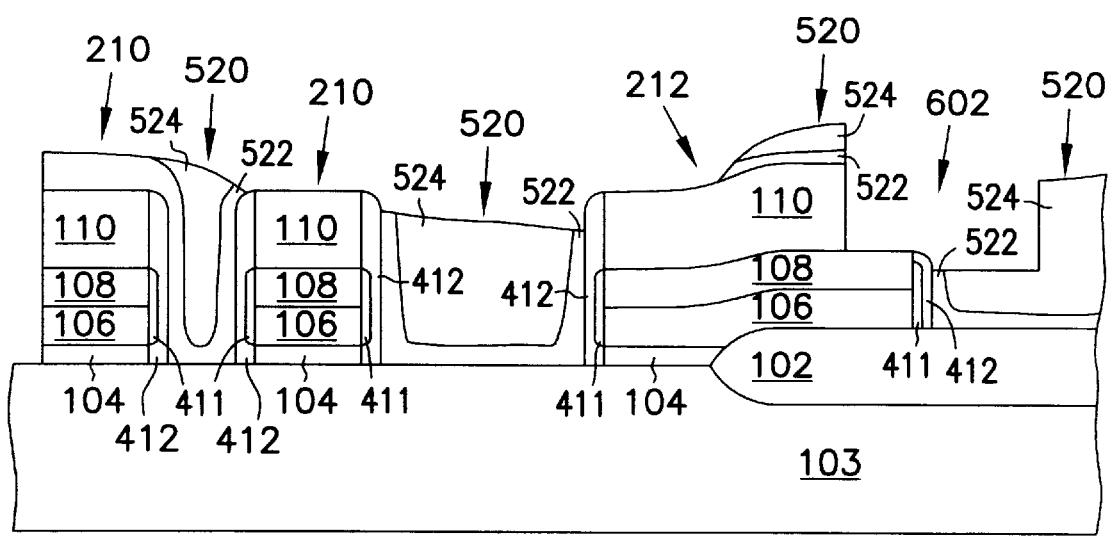
FIG. 6 is a cross-sectional view of the integrated circuit after removal of some insulator.

After planarization (step 270), a gate contact opening 602 is formed by patterning and removing some insulating film 520, insulator 110, and spacer 402 (step 272), as shown in FIG. 6. The gate contact opening 602 exposes the conductor 107. The patterning of the gate contact opening 602 is defined with a mask. The removal is performed with a nitride etch, such as a dry etch, that removes the insulating film 520, insulator 110, and spacer 402 at about the same rate.

If the position of the nitride etch is misaligned from the position of the gate etch in a direction away from the wordlines 210, additional insulating film 520 and some spacer 402 may also be removed. However, remaining insulating film 520 and the spacer 402 are sufficiently thick to prevent any field dielectric 102 from being removed. As a result, no undesirable short between the gate stack and the base layer 103 will occur. Thus, contact formation will not result in disabled transistors, and integrated circuit yield will increase. However, if the position of the nitride etch is misaligned from the position of the gate etch in a direction towards the wordlines 210, slivers of insulator 110 will not be formed because the insulator 110 is surrounded by the spacer 402 and insulating films. Thus, the completion of subsequent processing steps used to form the contact in the gate contact opening 602 will not be made more difficult.

Figure 7:
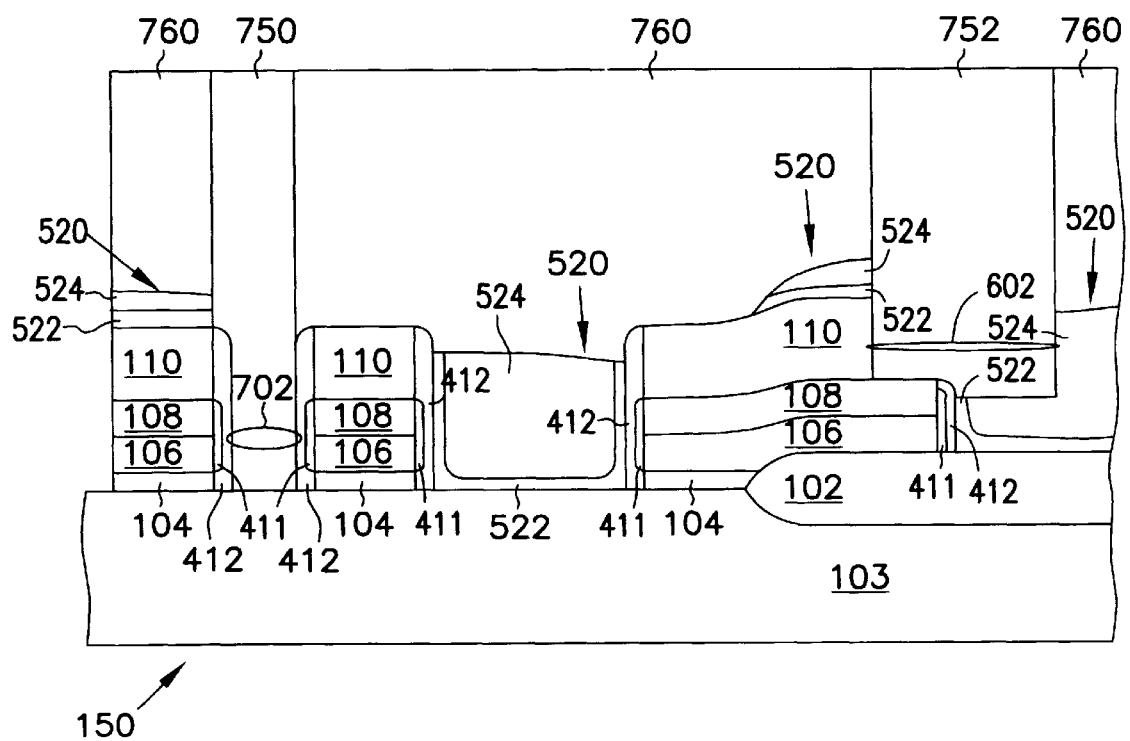
FIG. 7 is a cross-sectional view of the integrated circuit after contact formation.

Subsequently, additional dielectric 760, is formed (step 274), by deposition for example, to create a capacitor container and an insulator between the contacts 750, 752 as shown in FIG. 7. Then, the gate contact opening 602, again, and a bitline contact opening are defined, or formed, by patterning and removing some additional dielectric 760 (step 276). The patterning is accomplished with another mask. To make this process step tolerant of mask misalignments, the removal is performed with an etch that will remove the additional dielectric 760, but substantially no spacer 402. Thus, for example, an etch that is selective to nitride can be used to remove additional dielectric 760 which is not nitride, but no spacer 402 which is nitride. As a result, bitline and gate contacts 750, 752 can be formed (step 278) in self-alignment to the bitline and gate contact openings. The bitline and gate contacts 750, 752 can be formed by conventional metallization techniques.

We claim:

1. A method of forming an integrated circuit, comprising the steps of:

forming a gate stack on the integrated circuit;

forming an insulating film on the integrated circuit;

planarizing the insulating film;

forming a gate contact opening through at least a portion of the planarized insulating film.

2. The method of claim 1, wherein the gate contact opening is formed by removing the insulator, spacer and insulating film by etching; and wherein the insulator, spacer and insulating film are etched at substantially similar rates.

3. The method of claim 1, wherein the integrated circuit is a dynamic random access memory.

4. The method of claim 1, wherein the insulating film comprises tetraethyloxysilicate (TEOS) and borophosphosilicate glass (BPSG);

wherein the thickness of the TEOS is between 100 angstroms and 500 angstroms; and wherein the thickness of the BPSG is between 1000 angstroms and 3000 angstroms.

5. The method of claim 1, wherein the gate stack comprises:

gate dielectric on a base layer;

a conductor on the gate dielectric; and an insulator on the conductor.

6. The method of claim 1, wherein the gate stack is a wordline.

7. The method of claim 1, wherein the planarizing step is performed with chemical mechanical planarization to form a substantially flat topography on the surface of the integrated circuit.

8. A method of forming a dynamic random access memory (DRAM), comprising the steps of:

forming a gate dielectric on a base layer of the DRAM;

forming a conductor on the gate dielectric;

forming an insulator on the conductor;

removing selected areas of gate dielectric, conductor and insulator to form a gate stack on the DRAM;

forming a spacer on a sidewall of the gate stack;

forming an insulating film on the DRAM;

planarizing the insulating film;

forming a gate contact opening on the DRAM after the gate stack is formed;

wherein the gate contact opening is formed by removing the insulator, spacer and insulating film by etching; and wherein the insulator, spacer and insulating film are etched at substantially similar rates.

9. The method of claim 8, wherein the insulating film comprises tetraethyloxysilicate (TEOS) and borophosphosilicate glass (BPSG);

wherein the thickness of the TEOS is between 100 angstroms and 500 angstroms; and wherein the thickness of the BPSG is between 1000 angstroms and 3000 angstroms.

10. The method of claim 8, wherein the spacer comprises nitride.

11. The method of claim 8, wherein the gate stack is a wordline.

12. The method of claim 8, wherein the planarizing step is performed with chemical mechanical planarization to form a substantially flat topography on the surface of the DRAM.

13. A method of forming contacts in a dynamic random access memory (DRAM), comprising the steps of:

forming a spacer on a sidewall of a gate stack of the DRAM;

forming dielectric on the DRAM;

forming gate and bitline contact openings through the dielectric; and forming gate and bitline contacts in self-alignment to the gate stack.

14. The method of claim 13, wherein the step of forming the gate and bitline contacts is performed with an etch that removes the additional dielectric, but does not substantially remove the spacer.

15. A method of forming a dynamic random access memory (DRAM), comprising the steps of:

forming groups n and p wells on a base layer wherein such groups are separated by field oxide;

forming a gate oxide on the base layer;

forming a conductor on the gate dielectric;

forming silicon nitride on the conductor;

forming gate stacks on the DRAM;

forming nitride spacers on the sidewalls of the gate stacks;

forming borophosphosilicate glass (BPSG) on the DRAM;

planarizing the BPSG with chemical mechanical planarization to form a substantially flat topography on the surface of the DRAM;

forming a gate contact opening on the DRAM after the gate stacks are formed;

forming additional dielectric on the DRAM;

forming gate and bitline contact openings through the additional dielectric;

forming gate and bitline contacts in self-alignment to the gate stacks;

wherein the gate contact opening is formed by removing the insulator, spacer and insulating film by etching;

wherein the silicon nitride, nitride spacer and BPSG are etched at substantially similar rates; and wherein the step of forming the gate and bitline contact openings is performed with an etch that removes the additional dielectric, but does not substantially remove the nitride spacer.

16. The method of claim 15, further comprising the step of forming tetraethyloxysilicate (TEOS) on the DRAM before BPSG is formed on the DRAM;

wherein the thickness of the TEOS is between 100 angstroms and 500 angstroms; and wherein the thickness of the BPSG is between 1000 angstroms and 3000 angstroms.

* * * * *